United States Patent [19]

Katoh

[11] Patent Number: 4,710,029
[45] Date of Patent: Dec. 1, 1987

[54] PROJECTION TYPE EXPOSING APPARATUS

[75] Inventor: Kinya Katoh, Tokyo, Japan

[73] Assignee: Nippon Kogaku K. K., Tokyo, Japan

[21] Appl. No.: 796,785

[22] Filed: Nov. 12, 1985

[30] Foreign Application Priority Data

Nov. 19, 1984 [JP] Japan .................................. 59-244229

[51] Int. Cl.⁴ ............................................. G01B 11/00
[52] U.S. Cl. ..................................................... 356/401
[58] Field of Search ........................ 356/399, 400, 401; 250/548

[56] References Cited

U.S. PATENT DOCUMENTS

| | | | |
|---|---|---|---|
| 4,167,677 | 9/1979 | Suzki ..................................... | 356/401 |
| 4,362,389 | 12/1982 | Koizumi et al. ...................... | 356/401 |
| 4,492,459 | 1/1985 | Omata ................................... | 356/401 |

*Primary Examiner*—R. A. Rosenberger
*Attorney, Agent, or Firm*—Shapiro and Shapiro

[57] ABSTRACT

A projection type exposing apparatus includes a projection objective for projecting the image of a reticle having a predetermined pattern and a plurality of alignment marks onto a wafer, photoelectric alignment means having an imaging optical system for forming the images of the alignment marks on the reticle, a photoelectric detecting slit member disposed at a predetermined image position of the imaging optical system, and a slit image displacing optical member disposed in the optical path of the imaging optical system to optically displace the image position of the slit member on the reticle in a direction perpendicular to the lengthwise direction of the slit member, the slit member being designed such that the lengthwise direction thereof is coincident with a straight line intersecting the optic axis of the projection objective on the reticle, a movable stage for supporting the wafer thereon for movement relative to the projection objective, and a reference index mark member provided on the movable stage to set the reference position of the slit member in the photoelectric alignment means relative to the movable stage.

11 Claims, 10 Drawing Figures

PROJECTION TYPE EXPOSING APPARATUS

BACKGROUND OF THE INVENTION

1. Field of the Invention

This invention relates to an exposing apparatus used for the manufacture of semiconductor elements, and in particular to a reticle alignment optical system in a projection type exposing apparatus.

2. Description of the Prior Art

Heretofore, generally in a reduction projection type exposing apparatus, the images of a plurality of alignment marks provided on a reticle have been formed on a slit in an alignment optical system, and alignment of the reticle has been accomplished by the photoelectric signals from photoelectric detectors disposed rearwardly of the slit, with the slit as the reference. Such alignment is effected on the premise that the slit in the alignment optical system is kept in a strictly predetermined positional relation to the movement of a stage for supporting thereon a wafer as an exposed object on which the pattern on the reticle is printed by means of a projection objective. For this reason, it is necessary that by the use of a reference mark (fiducial mark) provided on the stage on which the wafer is placed, one slit in the alignment optical system and the fiducial mark be optically brought into coincidence with each other through the projection objective, whereafter the stage is moved, whereby the alignment optical system is adjusted so that the fiducial mark and another slit in the alignment optical system are coincident with each other through the projection objective.

In this case, the interval between the plurality of alignment marks on the reticle is determined to a predetermined value and therefore, in order to bring the fiducial mark into coincidence with the slit corresponding to one alignment mark and thereafter bring the fiducial mark into coincidence with the slit corresponding to the other alignment mark, the stage is moved by a value corresponding to the product of the value of the interval between the alignment marks and the projection magnification. Where the other alignment mark and the fiducial mark are not coincident with each other, the alignment optical system is adjusted by Harbing glass (a parallel flat plate rotatable to vary the inclination thereof relative to the optical axis) so that the two are coincident with each other. It is very important in alignment of the reticle to accurately align the slits in the alignment optical system relative to the running of the stage in this manner.

Figure 8:
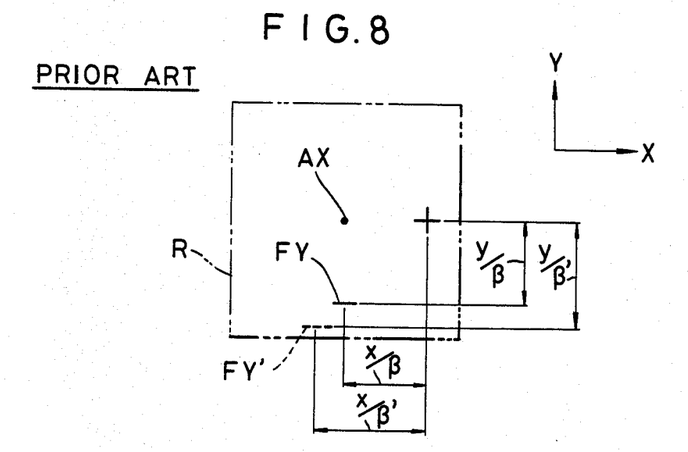
FIG. 8 is a plan view showing the positional relation of the fiducial mark on the surface of the reticle in the reticle alignment method according to the prior art when there is a fluctuation of the magnification of the projection objective.

However, when the optical position adjustment of each slit in the alignment optical system is to be effected by the fiducial mark through the projection objective, if the magnification of the projection objective is varied from a standard magnification by some cause or other, it is difficult to accomplish accurate alignment even if the stage is moved by the value of the product of the predetermined value of the interval between the alignment marks and the projection magnification, and this has led to the possibility of an error. Where, as shown in the plan view of FIG. 8 of the accompanying drawings (which shows the positional relation on the surface of the reticle R), the alignment marks on the reticle comprise a (+) mark and a (−) mark each centered along an edge of the reticle, namely, at a position along a line orthogonal to the optical axis Ax of the projection objective, if the projection magnification of the objective is varied from $\beta$ to $\beta'$ by some cause or other, the position of the fiducial mark on the reticle moves from $F_Y$ indicated by solid line to $F_Y'$ indicated by dotted line. Since the distance between the alignment marks formed on the reticle is determined to a predetermined value, the stage is moved by amounts x and y corresponding to the multiples of this value, but if the magnification of the projection objective is varied to $\beta'$, the position of the fiducial mark on the reticle is displaced not only in X direction but also in Y direction. If the reticle is to be aligned by the alignment optical system adjusted in such a state, the position of the reticle cannot be accurately aligned relative to the apparatus body and particularly, a rotational error of the reticle will occur. Thus, an error will occur during the superposition printing of a plurality of patterns on the wafer and it will become impossible to manufacture semiconductor elements having minute patterns high in degree of integration.

SUMMARY OF THE INVENTION

It is an object of the present invention to provide a projection type exposing apparatus in which alignment of a reticle can be accurately accomplished even when the projection magnification of a projection objective fluctuates.

According to the present invention, in a projection type exposing apparatus having a projection objective for projecting a pattern on a reticle onto a wafer, alignment optical systems each having an imaging optical system for forming the images of a plurality of alignment marks provided on the reticle and a photoelectric detecting slit disposed at the image plane position of said imaging optical system to detect the positions of said plurality of alignment marks, and a reference index mark formed on a stage supporting a wafer thereon to set the reference position of the slits in said alignment optical systems, the photoelectric detecting slit disposed at the image plane position of the imaging optical system in each of said alignment optical systems is constructed such that the lengthwise direction thereof is coincident with a straight line passing through the optic axis of the projection objective on the reticle, and Harbing glass for causing the relative position of the photoelectric detecting slits provided in the plurality of alignment optical systems to be optically varied by a minute amount in a direction perpendicular to the lengthwise direction of said slits is disposed in one of the alignment optical systems.

In in such a construction, it is a premise that the plurality of alignment marks provided on the reticle have directions intersecting each other on the optic axis of the objective. By adjusting the angle of inclination of the Harbing glass provided in one of the alignment optical systems, the slits in the alignment optical systems are strictly aligned relative to the running of the stage on the basis of the fiducial mark as the reference index mark provided on the stage, and the initial setting for aligning the reticle relative to the apparatus body is done.

Desirably, in order to precisely align the reticle on a predetermined plane, three alignment marks are provided so as to be orthogonal to one another for the correction of X and Y direction positions and the angle of rotation and therefore, it is desirable to provide three alignment optical systems each comprising an imaging system and a photoelectric detecting system correspondingly to the respective alignment marks. To enable two of the three alignment marks to be observed in the same view field, it is desirable to provide a view field combining prism for forming the images by two alignment optical systems juxtaposedly on the same plane, and to cause the optical paths of one alignment optical system whose view field is combined and the remaining one alignment optical system to intersect each other and provide an optical path changing-over mirror at the position of intersection.

DESCRIPTION OF THE PREFERRED EMBODIMENT

The present invention will hereinafter be described with respect to an embodiment thereof.

Figure 1:
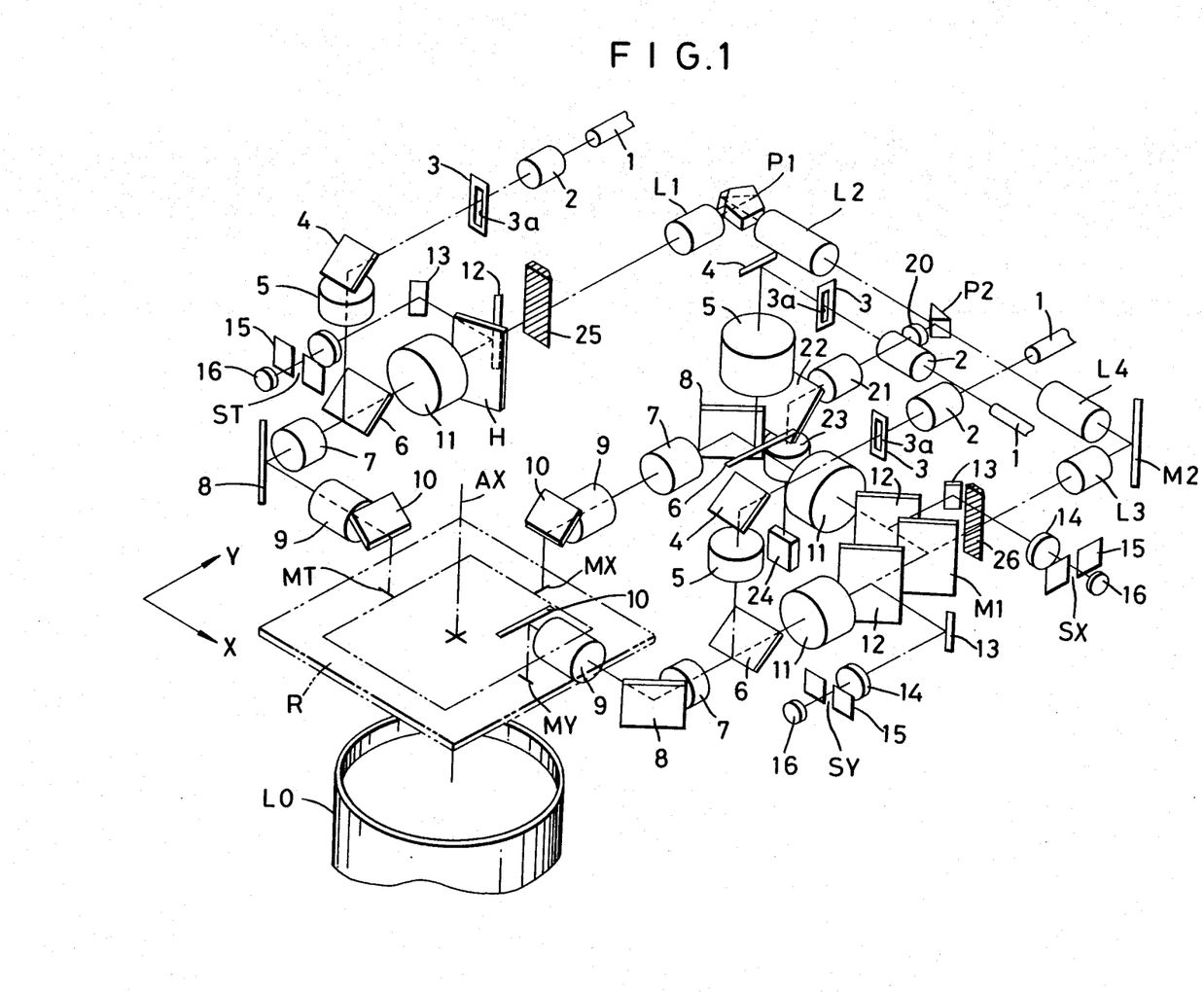
FIG. 1 is a schematic perspective view showing the construction of the reticle alignment optical systems according to the present invention.

FIG. 1 is a schematic perspective view showing a reticle alignment optical system in an embodiment wherein the present invention is applied to a reduction projection type exposing apparatus. A reticle R is uniformly illuminated from above as viewed in FIG. 1 by an illuminating system, not shown, and a predetermined pattern on the reticle is projected and imaged upon a wafer, not shown, as an object to be exposed, by a projection objective Lo. Three alignment marks for aligning the reticle R relative to the apparatus body, i.e., an alignment mark $M_X$ for alignment in X direction, an alignment mark $M_Y$ for alignment in Y direction, and an alignment mark $M_T$ for rotational alignment, are provided around the predetermined pattern area on the reticle R on lines that intersect the optic axis Ax of the projection objective Lo. The alignment mark $M_Y$ for alignment in Y direction and the alignment mark $M_T$ for rotational alignment lie on the same straight line passing through the optic axis, and the alignment mark $M_X$ for alignment in X direction is provided on a line orthogonal to said straight line. Alignment optical systems are provided corresponding to the respective alignment marks, and the respective alignment optical systems have slits corresponding to the respective alignment marks, and the images of the respective marks are formed on these slits and the positions of these images are detected, whereby the alignment of the reticle R relative to the apparatus body is accomplished.

In the three alignment optical systems, light rays of the same wavelength as the wafer exposure light by the projection objective are supplied as illuminating light by an optical fiber, and so-called coaxial epi-illumination is effected, and the illuminating system, the imaging system and the photoelectric detecting system by the slit are substantially identical to one another. So, the Y direction alignment optical system for the alignment mark $M_Y$ for alignment in Y direction will now be described as an example. The illuminating light from the optical fiber 1 is condensed on a field stop 3 by a condensing lens 2 and is reflected by a half-mirror or semi-transparent mirror 6 via an optical path bending mirror 4 and a relay lens 5. This reflected light is condensed on the reticle R by a reflecting mirror 10 via a relay lens 7, an optical path bending mirror 8 and an alignment objective 9. The image of the field stop 3 is formed on the reticle R by the relay lenses 5, 7 and the objective 9. The field stop 3 is provided with a slit-like opening 3a, and the lengthwise direction of this slit-like opening 3a is disposed so that the image of the opening is coincident with a line perpendicularly intersecting the optic axis Ax of the objective Lo on the reticle R. The light ray from the alignment mark $M_Y$ on the reticle R is reflected by a reflecting mirror 10, travels back along the objective 9, the optical path bending mirror 8 and the relay lens 7 and is transmitted through the semitransparent mirror 6. This transmitted light passes through a relay lens 11, is reflected by a half-mirror 12 or semitransparent mirror and is reflected by a minute vibratory mirror 13, whereafter it is condensed on a slit plate 15 having a slit $S_Y$, and the image of the alignment mark $M_Y$ provided on the reticle R is formed on the slit plate 15. The lengthwise direction of the slit $S_Y$ is disposed so as to correspond to a line that intersects the optic axis of the objective on the reticle. By the slit $S_Y$ putting the image of the alignment mark $M_Y$ therein, the relative alignment of the slit $S_Y$ and the alignment mark $M_Y$ is accomplished. A field lens 14 is disposed immediately in front of the slit plate, and a light beam passed through the slit $S_Y$ enters a photoelectric detector 16 and the quantity of this incident light is photoelectrically converted. The output of this photoelectric detector is synchronously detected by the driving signal of the minute vibratory mirror 13 vibrated at a high speed to vibrate the light beam in the widthwise direction of the slit $S_Y$, whereby the position of the alignment mark relative to the slit is accurately detected. This is as disclosed as prior art in Japanses Patent Publication No. 25602/1980 (corresponding to U.S. Pat. No. 3,912,372, issued Oct. 14, 1975) owned by the assignee.

The illuminating systems, the imaging systems and the photoelectric detecting systems by the slits in the alignment optical systems for the other alignment marks $M_X$ and $M_T$ are substantially the same as what has been described and therefore need not be described, but the slits in the respective alignment optical systems are constructed so that the lengthwise directions thereof correspond to straight lines intersecting the optic axis of the objective on the surface of the reticle. Also, the slits are constructed so that on the surface of the reticle, the lengthwise directions of the slits $S_Y$ of the Y direction alignment optical system and the slit $S_T$ of the rotational alignment optical system correspond to the same straight line and the lengthwise direction of the line corresponding to slit $S_X$ of the X direction alignment optical system is orthogonal to said straight line. In the drawings, members having similar functions are given similar reference numerals. The positions of the alignment marks on the reticle R are detected by the signals of the photoelectric detecting systems of such alignment optical systems, and the reticle R is moved by a servo system, not shown, so that the alignment marks on the reticle are accurately coincident with the slits of the respective alignment optical systems, whereby the alignment of the reticle relative to the apparatus body is automatically accomplished.

Figure 2:
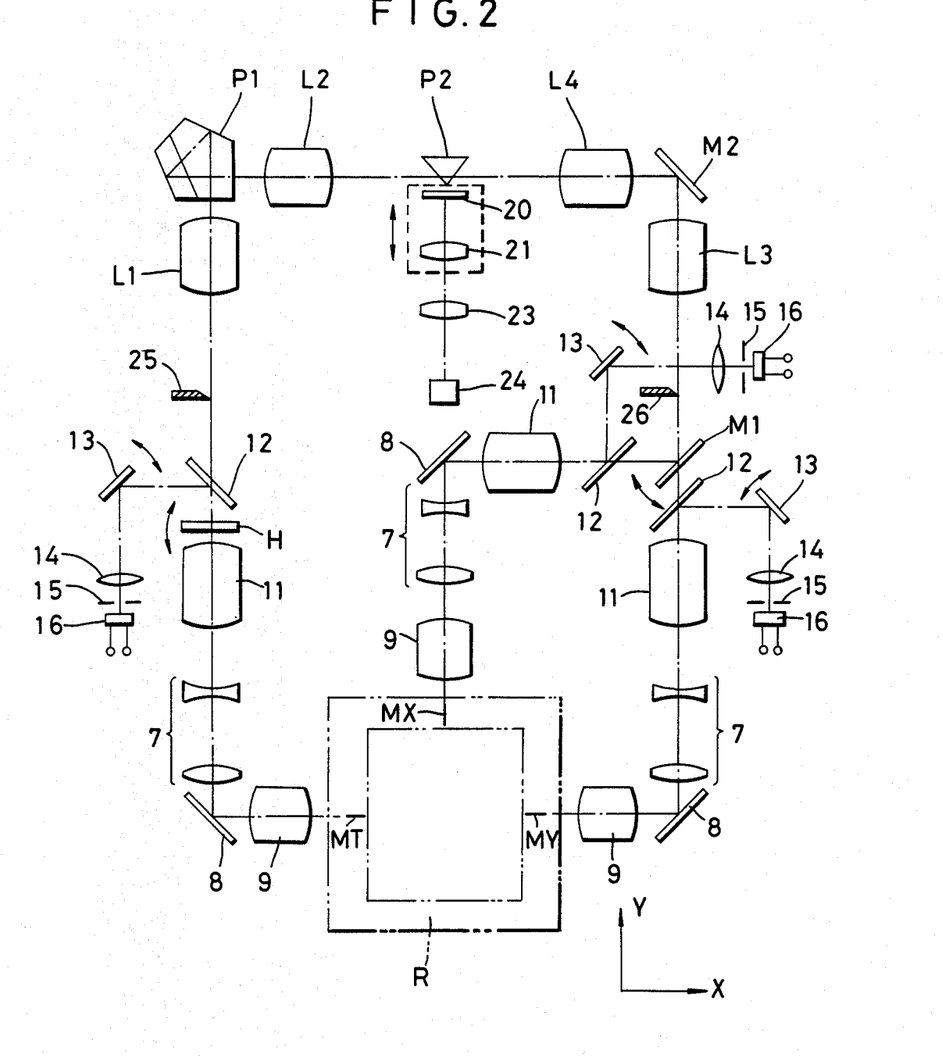
FIG. 2 is a schematic plan view of the reticle alignment optical systems of FIG. 1.

In addition to the photoelectric alignment systems for detecting the positions of such three alignment marks, there is provided an observation system for observing therethrough the positional relation between the images of the alignment marks. The construction of this observation system is shown in the schematic perspective view of FIG. 1, and is shown in greater detail in the schematic plan view of FIG. 2. In FIG. 2, in order to make the construction of the observation system easy to understand, the illuminating system of each alignment optical system, and the semitransparent mirror 6 for coaxial illumination are omitted and the positions of the members are partly changed. The observation system is constructed so that the image of each alignment mark is formed by the use of the light transmitted through the semitransparent mirror 12 provided in each alignment optical system.

The alignment optical system for the alignment mark $M_T$ for detecting the rotational position of the reticle will first be considered. By the light transmitted through the semitransparent mirror 12, the primary image of the alignment mark is formed on a first light-intercepting plate 25 for intercepting the light beam on one side relative to the optical axis. The light beam from this primary image is subjected to the converging actions of a first relay lens L1 and a second relay lens L2 for observation and the reflecting action of a pentagonal roof prism P1 disposed therebetween and is reflected by one inclined surface of a rectangular prism P2 as a view field combining prism and condensed on a focusing screen 20, and the secondary image of the alignment mark $M_T$ is formed on the focusing screen. The observation systems for the X direction alignment mark $M_X$ and the Y direction alignment mark $M_Y$ use in common a pivotable mirror M1 pivotably provided to change over the optical path, and are selectively constructed so as to observe one of the alignment marks therethrough. The light beam transmitted through the semitransparent-mirror 12 in each alignment system is selectively directed to the observation optical path by the pivotable mirror M1, and the primary image of one of the alignment marks $M_X$ and $M_Y$ is formed on a second light-intercepting plate 26 for intercepting the light beam on one side relative to the optic axis. The light beam from this primary image is subjected to the actions of a third relay lens L3 and a fourth relay lens L4 for observation and a reflecting mirror M2 for bending the optical path provided therebetween and is reflected by the other inclined surface of the view field combining prism P2 and condensed on the focusing screen 20, and the secondary image of the X direction alignment mark $M_X$ or the Y direction alignment mark $M_Y$ is formed on the focusing screen.

The view field combining prism P2 is disposed so that the edge line thereof on which the two reflecting surfaces thereof intersect each other is coincident with the same optic axis of the second relay lens L2 for observation and the fourth relay lens L4 for observation or lies somewhat near the focusing screen 20 with respect to said optic axis. The first light-intercepting plate 25 and the second light-intercepting plate 26 intercept the light beam which is about to pass between the edge line of the view field combining prism P2 and the focusing screen 20 and therefore, the light beam from one optical path does not enter the other optical path to create a ghost. Also, the view field combining prism P2 is constructed so that the edge line thereof is coincident with the center of the focusing screen and the optic axis of the relay lenses 21 and 23 for causing the image on the focusing screen to be re-imaged on the image pickup surface of an image pickup device 24 such as a television camera. The pentagonal roof prism P1 disposed in the alignment optical system for detecting the rotational position has the function of controlling the direction in which the image of the alignment mark $M_T$ is displaced within the observation view field when the reticle R is moved in the direction in which the other alignment mark image formed in the same view field is displaced, by the dark surface thereof.

Figures 3A, 3B:
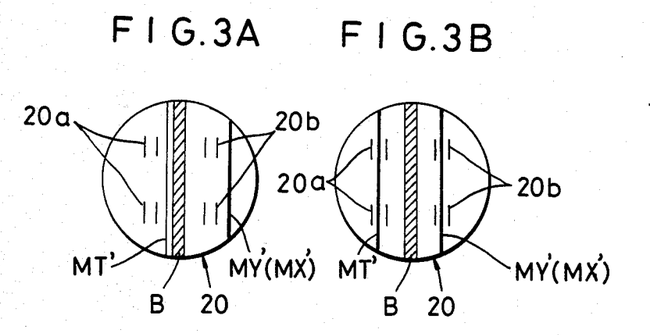
FIGS. 3A and 3B show the observation view fields of the reticle alignment marks by the observation systems of the alignment optical systems.

By the construction of the observation system using such view field combining prism P2, as shown in FIG. 3A, the image $M_T{'}$, of the rotational direction alignment mark is formed on the focusing screen 20 on one side of the view field and the image $M_X{'}$, of the X direction alignment mark or the image $M_Y{'}$, of the Y direction alignment mark is formed on the other side of the view field, and the positional relation between the two images can be observed by means of the image pickup device 24. After the automatic alignment by the aforementioned photoelectric detecting system, as shown in FIG. 3B, the images $M_T{'}$, and $M_X{'}$, or $M_Y{'}$, of the two alignment marks are aligned with embracing marks 20a and 20b for alignment provided on the focusing screen 20, whereby the state in which the alignment of the reticle has been achieved can be comfirmed. For the focusing of the two alignment mark images formed on the focusing screen 20, the focusing screen 20 and the relay lens 21 are moved together along the optic axis and thus, even in reticles of different thicknesses or refractive indices, it is possible to observe a sharp image. The black image B lying at the center of FIGS. 3A and 3B corresponds to the light-intercepting plates 25, 26 provided in the two observation systems whose view fields are combined with each other, and also corresponds to the edge line of the view field combining prism P2.

In the foregoing, a case has been described where the position of each alignment mark provided on the reticle R is detected by each alignment optical system, whereby the reticle is aligned relative to the alignment optical system, namely, the apparatus body. There will now be described the initial setting in which the adjustment relative to fiducial marks on a stage which provides the reference of alignment is effected in such an alignment optical system.

Figure 4:
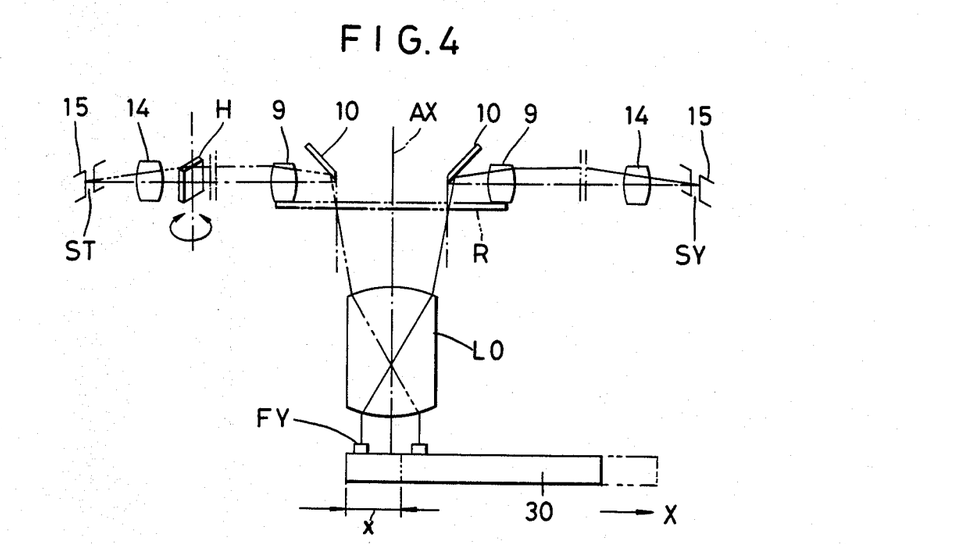
FIG. 4 is an optical path diagram showing the positional relation between a fiducial mark on a stage and the reticle alignment optical systems.
Figure 5:
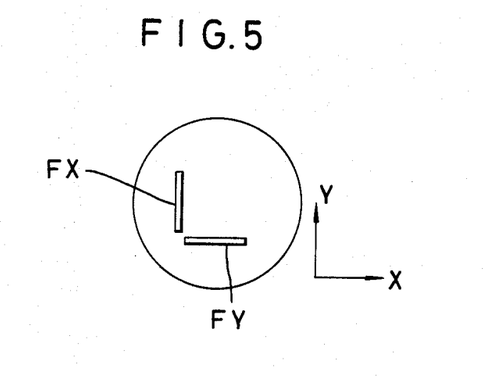
FIG. 5 is a plan view showing an example of the fiducial mark.
Figure 6A:
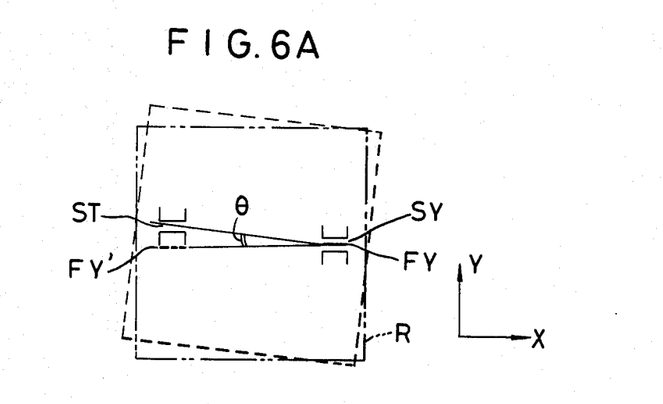
FIGS. 6A and 6B are plan views showing the positional relations on the surface of the reticle between the fiducial mark and each slit.
Figure 6B:
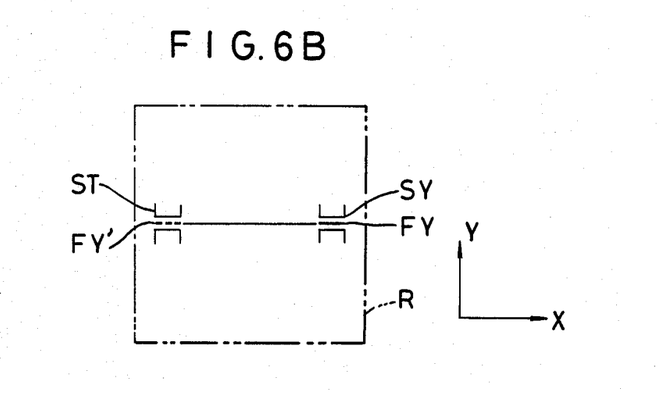

FIG. 4 is an optical path diagram showing the positional relation between the fiducial mark on a stage 30 and the reticle alignment optical system by the projection object Lo. In FIG. 4, the intermediate member of the alignment optical system is omitted and members necessary for adjustment are chiefly shown. The fiducial mark provided on the stage 30, as shown in the plan view of FIG. 5, comprises a fiducial mark $F_X$ for X direction alignment provided in parallelism to Y direction and a fiducial mark $F_Y$ for Y direction alignment provided in a direction orthogonal thereto. The mark $F_Y$ for Y direction alignment is used for the adjustment of the alignment optical system relative to the running of the stage Let it be assumed that as indicated by solid lines in FIG. 4, the fiducial mark $F_Y$ for Y direction alignment is brought into coincidence with a slit $S_Y$ in the Y direction alignment optical system by movement of the stage 30 and then, as indicated by dots-and-dash line in FIG. 4, the stage 30 is moved in X direction to thereby bring the fiducial mark $F_Y$ for Y direction alignment into coincidence with a slit $S_T$ in the rotational alignment optical system. Where, at this time, the slit $S_T$ in the rotational alignment optical system is not adjusted to the movement of the stage 30, the alignment optical system is inclined by $\theta$ relative to the X direction of movement of the stage, as shown in FIG. 6A. If, in this state, the reticle is aligned relative to the alignment optical system, the exposure of the reticle to the wafer is effected with the reticle remaining inclined with respect to the feeding of the stage as indicated by broken line in FIG. 6A and therefore, each exposed chip is inclined. So, by rotating Harbing glass H (a parallel) flat plate) provided in the imaging system of the rotational alignment optical system by a minute angle about an axis of rotation corresponding to the lengthwise direction of the slit $S_T$, as shown in FIG. 4, the slit $S_T$ is optically moved in the widthwide direction thereof (the direction perpendicular to the lengthwise direction) relative to the fiducial mark $F_Y$, whereby the two are adjusted so as to coincide with each other as shown in FIG. 6B. Thus, in this state, the rotational error of the alignment optical system has been completely eliminated relative to the direction of running or movement of the stage, and the initial setting of the alignment optical system relative to the apparatus body is completed. FIGS. 6A and 6B are plan views showing the positional relation on the reticle between the fiducial mark and the slits.

Figure 7:
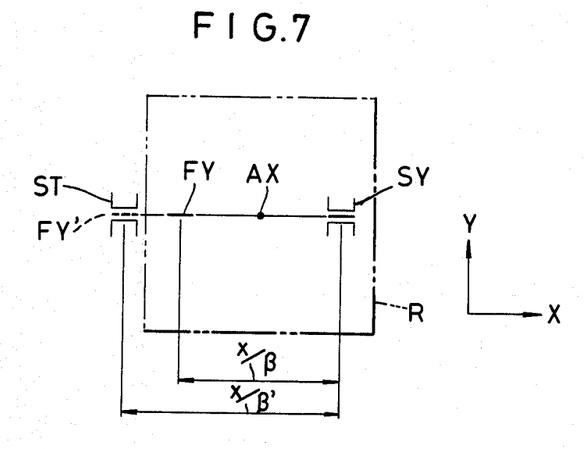
FIG. 7 is a plan view showing the positional relation of the fiducial mark on the surface of the reticle when there is a fluctuation of the magnification of the projection objective.

In the alignment optical system as described above, where the initial setting relative to the running of the stage is to be effected, there is no possibility of causing a rotational error even if the magnification of the projection objective fluctuates from the standard magnification, as shown in FIG. 7 which shows the positional relation on the reticle like FIG. 6. In FIG. 7, where the stage is moved to effect the adjustment of the rotational alignment optical system relative to the slit $S_T$ after the slit $S_Y$ of the Y direction alignment optical system and the fiducial mark $F_Y$ for Y direction alignment have been brought into coincidence with each other, the fiducial mark $F_Y$ when the projection magnification of the projection objective from the reticle to the wafer is a reference value $\beta$ is indicated by solid line and the fiducial mark $F_Y{'}$, when the projection magnification fluctuates to $\beta'$ is indicated by dotted line. That is, relative to the amount of movement x of the stage, the amounts of movement of the fiducial marks on the surface of the reticle R are $x/\beta$ and $x/\beta'$, respectively. In FIG. 7, this difference is shown exaggerated. As described above, in the construction according to the present invention, the lengthwise direction of each slit corresponds to a line that intersects the optic axis of the projection objective on the surface of the reticle, and the direction in which the stage is moved for the position adjustment thereof relative to the slit $S_T$ of the rotational alignment optical system after the slit $S_Y$ and the fiducial mark $F_Y$ in the Y direction alignment optical system have been brought into coincidence with each other is always a direction across the optic axis of the projection objective and therefore, as shown, the corresponding position of the fiducial mark $F_Y$ on the surface of the reticle lies on the same straight line passing through the optic axis Ax even when the magnification of the projection objective is fluctuating. Therefore, displacement in Y direction does not occur relative to the movement of the stage in X direction as in the prior art shown in FIG. 8. Accordingly, even when there is a fluctuation of the magnification of the projection objective, it is possible to accurately align the alignment optical system without any rotational error relative to the running of the stage, namely, the apparatus body.

Movement of the stage is very precisely effected in X direction and Y direction orthogonal to each other by an interferometer and therefore, if correction of the rotational error is effected only relative to the running of the stage in X direction as described above, the initial setting of the alignment optical system relative to the apparatus body will be sufficient. Also, the relay lens 7 in each alignment system, as shown in FIG. 2, comprises a so-called Galilean system comprised of a positive lens and a negative lens, and where the projection objective is replaced by one having a different magnification, this Galilean system is reversely disposed so that the size of the fiducial mark image formed on the slit in each alignment system does not change. Further, while the above-described embodiment is a reduction projection type exposing apparatus, this is not restrictive. The present invention is equally effective in a projection type exposing apparatus wherein the position adjustment of the reticle alignment optical system is effected through a projection objective with the aid of a reference index mark provided on a stage supporting a wafer thereon.

According to the present invention, as described above, a projection type exposing apparatus of excellent performance is achieved in which even when the projection magnification of the projection objective is varied by some cause or other, it is possible to accurately effect the position adjustment of the reticle alignment optical system which provides the reference of the reticle alignment and which enables the manufacture of super LSI higher in degree of integration.

I claim:

1. A projection type exposing apparatus including:
   (a) a projection objective for projecting the image of a first object having a predetermined pattern and a plurality of alignment marks onto a second object;
   (b) photoelectric alignment means for aligning said first object, said photoelectric alignment means having an imaging optical system for forming images of the alignment marks of said first object, a photoelectric detecting slit member disposed at a predetermined image position of said imaging optical system, and slit image displacing optical means for optically displacing the image position of said slit member on said first object in a direction perpendicular to the lengthwise direction of said slit member, said slit member being designed such that the lengthwise direction of the image of said slit member on said first object is coincident with a radial direction from the optic axis of said projection objective;
   (c) a movable stage for supporting said second object thereon for movement relative to said projection objective; and
   (d) a reference index mark member provided on said movable stage, said slit image displacing optical means displacing the image of said slit member so that the image of said slit member substantially corresponds to the image of said reference index mark member which said projection objective projects on said first object when said movable stage is disposed at a predetermined position, whereby rotational error of said photoelectric alignment means relative to said movable stage is eliminated.

2. A projection type exposing apparatus according to claim 1, wherein said slit image displacing optical means has a parallel flat member having an angle of inclination variable with an axis optically parallel to the lengthwise direction of said slit member as the center of rotation.

3. A projection type exposing apparatus according to claim 2, wherein said photoelectric alignment means has first, second and third alignment systems, each of said first, second and third alignment systems has said imaging optical system and said slit member, said first alignment system further has said slit image displacing optical means, and the slit members in said first, second and third alignment systems are disposed so that the lengthwise directions thereof correspond to lines that are orthogonal to one another on said first object.

4. A projection type exposing apparatus according to claim 3, further comprising:
a view field combining optical system for forming images by the imaging optical systems in said first and second alignment systems in the same view field;
said view field combining optical system having a view field combining prism for combining the images by the imaging optical systems of said first and second alignment systems, a focusing screen on which the images combined by said view field combining prism are formed, and a lens member for observing therethrough the images formed on said focusing screen.

5. A projection type exposing apparatus according to claim 4, wherein said focusing screen and said lens member in said view field combining optical system are movable together along the optic axis of said lens member for the purpose of focusing.

6. A projection type exposing apparatus according to claim 4, wherein said view field combining optical system further has an optical path changing-over member for changing over the image by said second alignment system and the image by said third alignment system to enable the image by said third alignment system, instead of the image by said second alignment system, to be observed in the same view field as the image by said first alignment system.

7. A projection type exposing apparatus according to claim 6, wherein said optical path changing-over member is a pivotable mirror disposed at a point of intersection between the imaging optical system of said second alignment system and the imaging optical system of said third alignment system.

8. A projection type exposing apparatus including:
(a) a projection objective for projecting the image of a first object having a predetermined pattern and a plurality of alignment marks onto a second object;
(b) a plurality of photoelectric alignment means for aligning said first object with said apparatus, each of said plurality of photoelectric alignment means having an imaging optical system for forming an image of an associated alignment mark of said first object and having a photoelectric detecting slit member disposed at a predetermined image position of said imaging optical system, and slit image displacing optical means for optically displacing the image position of one of said slit members on said first object in a direction perpendicular to the lengthwise direction of that slit member, the slit members of two of said plurality of photoelectric alignment means being designed such that a line segment which connects the images of said slit members of said two photoelectric alignment means intersects the optic axis of said projection objective on said first object and the lengthwise directions of the images of said slit members of said two photoelectric alignment means correspond to each other;
(c) a movable stage for supporting said second object thereon for movement relative to said projection objective; and
(d) a reference index mark member provided on said movable stage, said slit image displacing optical means displacing the image of said one of said slit members so that the last-mentioned image substantially corresponds to the image of said reference index mark member which said projection objective projects on said first object when said movable stage is disposed at a predetermined position, whereby rotational error of at least one of said photoelectric alignment means relative to said movable stage is eliminated.

9. An apparatus according to claim 8, wherein the slit member of a photoelectric alignment means other than said two is designed such that the lengthwise direction of the image of the slit member thereof is substantially perpendicular to said line segment.

10. An apparatus according to claim 9, wherein said two photoelectric alignment means detect rotation of said first object about the optic axis of said projection objective.

11. An apparatus according to claim 8, wherein said plurality of alignment marks of said first object are designed such that the lengthwise direction of each of said plurality of alignment marks is coincident with a radial direction from the optic axis of said projection objective.

* * * * *